United States Patent [19]

Miller

[11] 4,081,901
[45] Apr. 4, 1978

[54] METHOD OF MAKING A TERNARY BARRIER STRUCTURE FOR CONDUCTIVE ELECTRODES

[75] Inventor: Lewis F. Miller, LaGrangeville, N.Y.

[73] Assignee: International Business Machines Corporation, Armonk, N.Y.

[21] Appl. No.: 765,551

[22] Filed: Feb. 4, 1977

Related U.S. Application Data

[62] Division of Ser. No. 535,261, Dec. 23, 1974, Pat. No. 4,017,889.

[51] Int. Cl.² ........................................ H01R 43/00
[52] U.S. Cl. .................................. 29/630 R; 29/590; 228/193; 228/254; 427/89
[58] Field of Search ................... 29/630 R, 629, 589, 29/590; 357/67, 68, 71; 427/89, 91; 228/254, 193

[56] References Cited

U.S. PATENT DOCUMENTS

| | | | |
|---|---|---|---|
| 3,597,665 | 8/1971 | Quetsch et al. | 357/67 |
| 3,807,625 | 5/1974 | Brown et al. | 357/71 |

*Primary Examiner*—Carl E. Hall

*Attorney, Agent, or Firm*—George O. Saile

[57] ABSTRACT

A ternary barrier structure and method for forming the structure to be used on a conductive electrode. In electronic structures, dielectric substrates are used which have a plurality of connecting conductive areas which are wettable by solder. The region surrounding these connecting conductive areas are not wettable by solder. Barrier structures are used to prevent the flow of the solder while the solder is liquid during the manufacture of these electronic products. The present barrier structure covers at least a portion of one of these connecting conductive electrodes wherein the electrode is composed predominately of silver and a lesser quantity of one or more of the platinum metals. The barrier structure includes a gold bearing, non-wettable by solder, glaseous layer over a portion of the electrode. The portion of the conductive electrode under and adjacent to the barrier glaseous layer contains a gold-silver alloy which is produced during the formation of the barrier structure by diffusion of the gold from the glaseous layer into the conductive electrode. A particularly corrosion resistant barrier structure and conductive electrode combination is thereby produced at this rather critical point in the microminiature circuit structure.

10 Claims, 6 Drawing Figures

METHOD OF MAKING A TERNARY BARRIER STRUCTURE FOR CONDUCTIVE ELECTRODES

This is a division of application Ser. No. 535,261, filed Dec. 23, 1974, now U.S. Pat. No. 4,017,889.

BACKGROUND OF THE INVENTION

The invention relates to methods for forming a ternary metal barrier structure on a conductive electrode and the resulting structure which is particularly corrosion resistant. The structure is useful in various microminiature circuit structures such as semiconductor chip joining sites and cross-overs.

DESCRIPTION OF THE PRIOR ART

One form of microminiature circuit structure utilizes a dielectric substrate or carrier of a variety of materials such as glass, various types of ceramic, such as alumina, and various types of plastic material. Formed upon or within the carrier are conductive electrodes. Solder is often applied to at least portions of the conductive electrodes to provide a means for subsequently joining components to the conductive electrodes on the carrier. Examples of components include semiconductor discrete diodes and transistors, integrated circuits, resistors, capacitors, cross-overs, etc.

A very important conductive electrode type which is applied to these carriers is an electrode composed predominantly of silver and to a lesser quantity of one or more of a platinum group of metals. These conductive electrode patterns are deposited according to the conventional thick film depositing techniques wherein a metallic paste of the metal is typically silk-screened onto the surface. Small quantities of a vitreous frit such as any of a variety of types of glasses are included in the paste which upon firing coalesces and acts to bond the metals to the substrates and to themselves. A description of this type of material is given in the U.S. Pat. No. 3,374,110 of Lewis F. Miller entitled "Conductive Element and Method" and assigned to the assignee of the present invention. In this patent, a silver-palladium alloy is described.

In the art, the one barrier structure extensively used has been a glass layer on thick film conductive electrodes of the type shown in the Miller U.S. Patent cited above and in the B. Agusta U.S. Pat. No. 3,508,209 entitled "Monolithic Integrated Memory Array Structure Including Fabrication and Package Therefor" and assigned to the same assignee as the present invention. This type of barrier structure has found extensive use in the flip-chip bonding of semiconductor devices by high lead content solder reflow techniques. This type of barrier electrode and solder reflow flip-chip bonding is extensively described in the Miller U.S. Pat. Nos. 3,429,040 and 3,495,133, both assigned to the same assignee as the present invention.

SUMMARY OF THE PRESENT INVENTION

In accordance with the present invention, the life of a microminiature circuit device can be increased and the structure made more corrosion resistant by using a barrier structure which includes a gold bearing, non-wettable by solder, glaseous layer over a portion of the conductive electrode which is predominantly silver and contains a lesser quantity of one or more platinum metals. The portion of the electrode under the silver and platinum group metal electrode under the barrier structure includes a gold-silver-platinum group metal alloy. This ternary metallic structure in combination with the barrier structure is particularly corrosion resistant for long periods of time, even where particularly corrosive atmospheres of sulphur bearing gases are present. The gold is diffused into the conductive electrode region, where it is most necessary for corrosion preventive purposes, during the heating of the composite of conductive electrodes.

DESCRIPTION OF THE PREFERRED EMBODIMENTS

Figure 1:
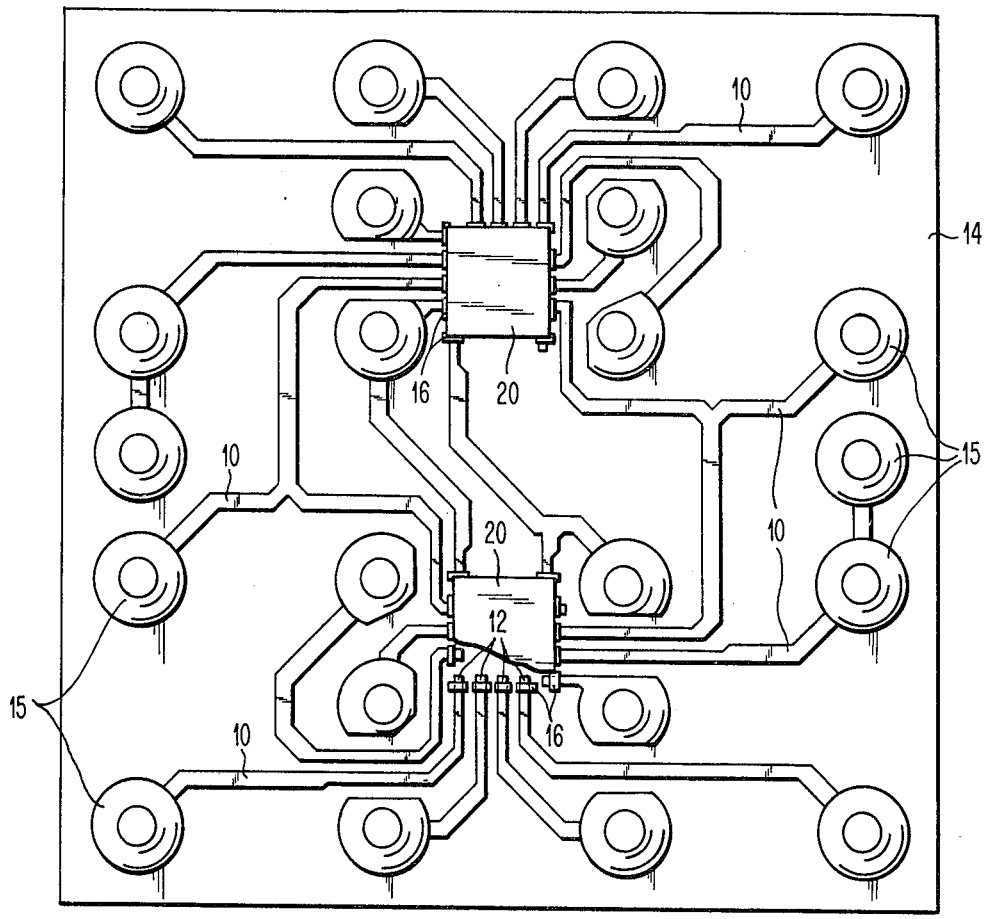
FIG. 1 shows the top view of semiconductor integrated circuit chips mounted upon conductive electrodes on the surface of a dielectric substrate.
Figure 2:
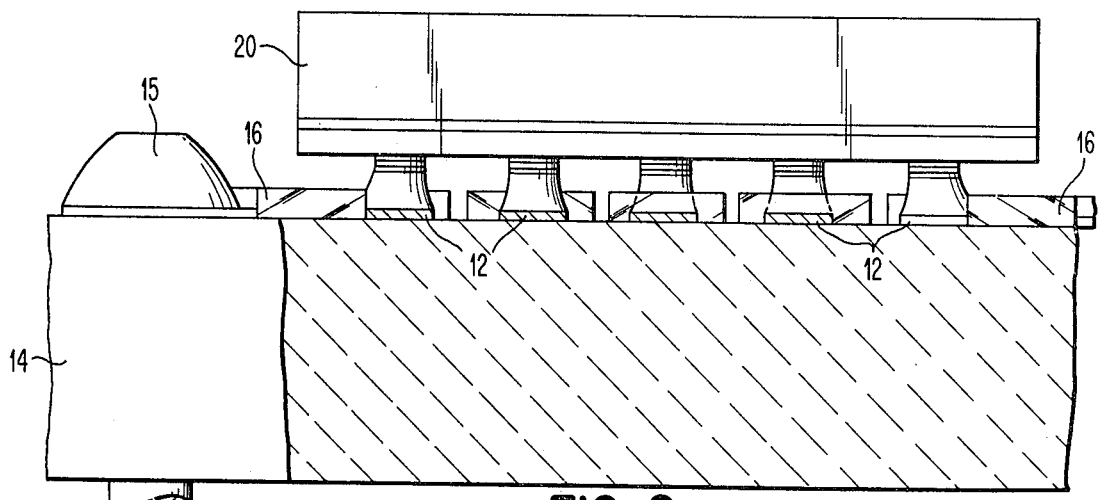
FIG. 2 shows a close-up side view of a semiconductor integrated circuit chip of FIG. 1.

FIGS. 1 and 2 illustrate one form of the barrier structure of the present invention and the method for manufacturing the same. This particular barrier structure of these FIGURES involve their use in the joining of semiconductor active, passive or integrated circuit chips onto a supporting substrate. A wettable with solder electrically conductive pattern 10 composed of silver and a lesser quantity of a platinum group/metal having a plurality of connecting areas 12 is screened onto a supporting dielectric substrate 14 which contains pins 15 to connect to a higher level circuit board. The pattern 10 is dried and usually fired wherein a vitreous frit is used as a binder for the conductive material. The barrier structure pattern 16 having a significant gold constituent and which is not wettable with the solder is applied to the conductive pattern 10. The material can be printed by any conventional technique in the desired pattern, dried and fired to produce a coating that is not wettable with solder. A coating of lead-tin solder wherein the lead content is greater than 80% in the molten metal is then applied to the solder wettable area such as by dipping the substrate into a solder bath or other similar techniques. A flux may be applied over the solder. A microminiature component such as an integrated circuit 20 having solder contacts (not shown) extending therefrom is positioned on the connecting areas of the conductive pattern 12. The substrate, semiconductor chip component and connecting solder are heated in a suitable oven or furnace where the solder contacts and the connecting areas are held at a temperature and for a time sufficient to soften the solder. The solder ball on the semiconductor chip and the solder from the connecting area form the unified solder mask at this temperature. The solder maintains itself in substantially a ball on the connecting areas 12 because of the surface tension phenomena caused by the fact that the solder does not wet the pattern 16 and the surrounding dielectric substrate 14. The temperature is then reduced to room temperature and the solder solidifies to give the resulting structure of FIG. 2.

The conductive pattern 10 is composed of silver-platinum metal alloy, one of which being an alloy of silver and palladium or palladium oxide such as described in U.S. Pat. No. 3,374,110 of Lewis F. Miller entitled "Conductive Element and Method" and assigned to the same assignee as the present invention.

The other platinum metals which will perform in a similar manner to palladium are platinum, osmium, iridium, ruthenium, and rhodium. The silver content in the finished conductor is greater than about 75% because the cost is lower, the conductivity is greater and the Pd does not oxidize during air firing.

The silver-platinum metal alloy has mixed with it small quantities of a vitreous frit which acts to bond the metals to a substrate and to themselves. The vitreous frit component of the conductor would be in the range of anywhere from one to ten percent by weight of the solid constituent. The particular vitreous frits which are operable in composition would be the same that are described in the beforementioned patent U.S. Pat. No. 3,374,110 involving silver-palladium.

Conductors using reactive bonding material such as described in R. G. Loasby et al "Enhanced Property Thick-Film Conductor Pastes", Solid State Technology, May 1972, pp 46-60, may also be used. A typical reactive bonding material is under one weight percent of copper oxide. This points up the fact that the amount or type of frit is immaterial.

The next important aspect of the invention involves the requirement for a gold-bearing constituent in the barrier coating deposit. The preferred percent of gold in weight percent is 20% or to provide sufficient corrosion resistance. This gold bearing composition would contain a vitreous frit to hold particles together, together with suitable binder and vehicle to spread the paste by the usual printing such as silk screen techniques. The vitreous frit may be any one or a combination of finely divided materials including colloidal silica, alumina, oxides, nitrides, borides, carbides or silicides. The barrier coating is then fired in a furnace at an elevated temperature to sinter it to a firm structure and more importantly to form under the barrier coating a gold, silver and platinum group metal alloy.

Figure 3:
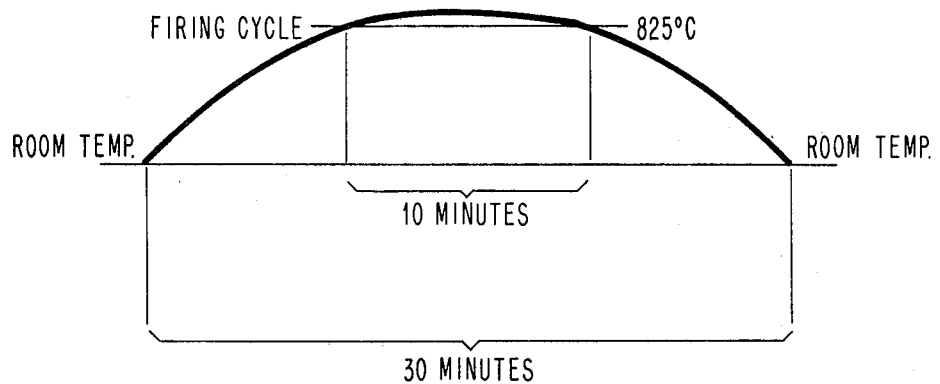
FIG. 3 shows the firing temperature profile using in the Examples.

The firing temperature range is between about 750° to 1050° C. for greater than about 5 minutes. Below 750° C the gold doesn't diffuse into the stripe satisfactorily and above about 1050° C the gold melts. One firing cycle which has given particularly valuable results is shown in FIG. 3 wherein the structure is brought from room temperature through a 10 minute firing cycle at 825° C and then down again to room temperature within a 30 minute overall period.

The high lead content solder, that is greater than about 80%, has in the prior art glass barrier structure tended to leach out the non-silver component in the conductor. The effect was to leave pure silver conductor available for sulfur corrosion. The gold barrier layer forms a stable gold/silver alloy which resists the corrosion even if the platinum metal is depleted from the structure by the molten solder.

Cross-sections and electron microprobe analysis have shown that when the gold barrier layer is fired on top of the previously fired silver platinum group metal conductor, some of the silver diffuses out into the gold and some of the gold fuses down into the silver noble metal conductor to form a ternary composition. With one firing at 825° C, the gold apparently moves about half way down to the dielectric substrate 14. Two or more firings at 825° C moves the gold down to the substrate itself. The platinum group metal remains reasonably intact, although some platinum group metal moves up into the gold region also. Electron microprobe analysis also shows that the lead-tin solder reacts with the top surface of the gold barrier layer probably to form a tin-gold intermetallic compound. The solder covers the underlying silver-platinum group metal conductive pattern and forms a continuous layer over the gold barrier layers themselves. No dewetting occurs near the barrier layer, unlike the glass barrier layers of the prior art. Thus, compared to the glass barrier layer, there is no easy place for a sulphur corrosion to initiate. Where the platinum metal depletion has occurred, no free silver is left. It is confined with gold and is corrosion resistant.

Figure 4A:
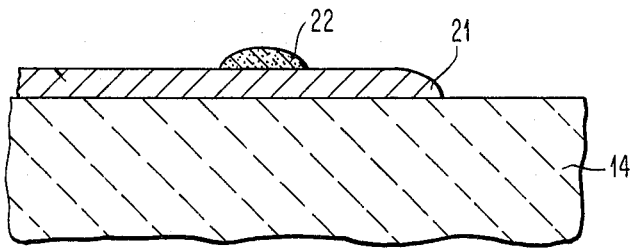
FIGS. 4A, B, and C schematically illustrates the process of the invention.

The structure and improvement of this invention can be more fully understood by reference to FIGS. 4A, B, and C. FIG. 4A shows the fired conductor 21 carried on a substrate 14. A dried gold barrier 22 is deposited on top of conductor 21. No interaction between the layers has yet taken place.

Figure 4B:
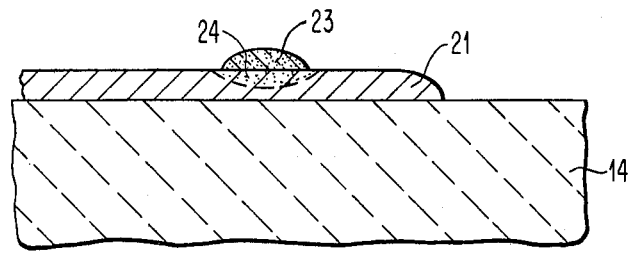

FIG. 4B shows the same structure after firing according to the cycle shown in FIG. 3. Much of the conductor 21 is unchanged, but the section underlying the gold barrier has been converted to a gold rich compound. Some of the silver from conductor 21 has diffused upward into the gold barrier, forming a gold/silver composition 23 which is rich in gold.

Figure 4C:
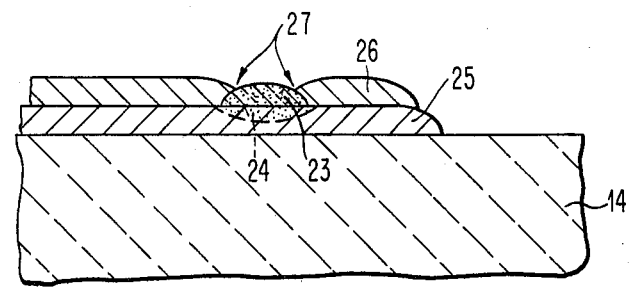

FIG. 4C shows the structure after tinning with a high lead-low tin solder. Some of the conductor has been depleted, now 25, and now consists of lead/palladium compound with some free silver. Solder 26 wets the entire conductor surface, and abuts closely to gold barrier 23. Site 27 is the normal area where corrosion would occur with a non-gold barrier. Corrosion cannot occur in this case since solder 26 wets right up to the gold barrier 23, and the underlying gold rich layer 24 prevents penetration from corrosive species such as sulfur. No entry is now available for sulfur or the like to attack the free silver which was caused by the depletion reaction between the solder and conductor 21.

Such barrier layers can be used to prevent tinning of conductors wherever desired, without the threat of sulfide corrosion, and without sacrifice of the conductor properties. The conductivity of the underlying conductor is increased by the additional material in the barrier.

The following Examples are included merely to aid in the understanding of the invention and variations may be made by one skilled in the art without departing from the spirit and scope of the invention.

EXAMPLE 1

A pattern which provided 25 parallel 4 mil wide lines on 8 mil centers was screened onto 10 alumina substrates with silver/palladium paste and fired at 825° C. using the furnace profile shown in FIG. 3. The paste had the following composition in parts by weight:
 Silver: 76.8
 Palladium: 19.2
 Glass frit: 4
The glass frit was composed of in parts by weight:
 Aluminum oxide: 2.2
 Silicon dioxide: 22.4
 Lead oxide: 66.6
 Boron oxide: 8.8
A 25% by weight vehicle of ethylcellulose dissolved in butylcarbitol acetate had been added to the mixture to form the paste.

Non-tinning (i.e. not wettable with solder) gold and glass coating stripes were each deposited perpendicular to the pattern lines in groups of at least three stripes. The solids of the compositions are given as Au-1 for gold in parts by weight in Table I and glass barrier in Table II:

Table I

|  | Au-1 | Au-2 | Au-3 | Au-4 | Pt | Pd | Pt/Pd |
|---|---|---|---|---|---|---|---|
| Gold Powder | 74 | 40 | 75 | 25 |  |  |  |
| Pt Powder |  |  |  |  | 62 |  | 25 |
| Pd Powder |  |  |  |  |  | 75 | 25 |
| Glass Frit 1 | 3 | 35 | 4.5 | 45 |  |  |  |
| Glass Frit 2 |  |  |  |  | 10 | 3 | 2 |
| Colloidal Silica | 2 | 2 | 1.5 | 2.25 | 3 |  |  |
| Silicon Resinate |  |  |  | 7 |  |  |  |
| 6566 Au Resinate (Hanovia Div. Engelhard Ind.) | 21 | 22 | 12 | 25 |  |  |  |

Table II

|  | Glass Frit 1 | Glass Frit 2 | Glass Barrier |
|---|---|---|---|
| $SiO_2$ | 22.4 | 73 | 65.5 |
| $B_2O_3$ | 8.8 | 16.5 | 24.1 |
| $Na_2O$ |  | 4.5 | 4.1 |
| PbO | 66.6 | 6 |  |
| $Al_2O_3$ | 2 |  | 2.2 |
| $K_2O$ |  |  | 4.1 |

The paste composition is made up of the solids given in Tables I and II plus the vehicle composition. The solids are given in Table I and the remainder up to 100% is the vehicle composition.

The vehicle composition used was as follows in parts by weight:
Butyl carbitol acetate: 75%
Ethyl cellulose: 20%
Oleoyl sarkosine: 5%

The stripes were fired at 825° C moving 4 inches/minute through the furnace cycle shown in FIG. 3. The pattern was coated with a 90% lead 10% tin solder by dipping it in a solder bath for 10 seconds. The samples were put into a closed chamber containing flowers of sulfur held at 125° C. resulting in an atmosphere containing 900 parts per million of sulfur and periodically examined under a microscope for visual signs of corrosion. Table I summarizes the results of these tests. It should be noted that the acceleration factor for this test compared to normal field exposure is about 2,000 times. As can be seen, the sample preparation, particularly in terms of number of firings and reflows, changes from test to test. Each firing was done under the same furnace conditions described. Solder reflow, where done, was after the application of the solder and under the following conditions: 345° C. ± 5° C, 3 minutes, in an inert atmosphere, as nitrogen or argon.

Table III

| Example | Samples | Coating Fired | Reflowed | Barrier Layer | First Sign of Corrosion | Hours on Test |
|---|---|---|---|---|---|---|
| 1 | 10 | 2X | No | Au-1 | Untinned Section dark at 336 hrs. Most areas bright at 480 hours | 480 |
| 2 | 6 | 1X | Yes | Glass | 24 hrs. spots | 300 |
|  |  |  |  | Pd | 68 hrs.(Did not stop corrosion) |  |
|  |  |  |  | Glass | Dark 68 hrs. |  |
|  |  |  |  | Au-1 | At 300 hrs. some crystals, dark on untinned sections only |  |
| 3 | 5 | 1X | Yes | Pt | 146 hrs. many crystals | 146 |
|  |  |  |  | Glass | Seemed clean at 146 hrs. |  |
|  |  |  |  | Au-2 | Clean |  |
|  |  |  |  | Au-3 | 146 hrs. few crystals |  |
| 4 | 5 | 1X | Yes | Pt/Pd | 146 hrs. crystals | 146 |
|  |  |  |  | Glass | 22 hrs. some spots |  |
|  |  |  |  | Au-4 | Clean |  |
|  |  |  |  | Au-1 | 146 hrs.-a few untinned spots are darker |  |

EXAMPLE 2

The procedure of Example 1 was followed and the conditions of Table III as given except the non-tinning coating stripes were of the compositions in parts by weight on each sample are given in Table I for Pd and Au-1 and Table II for the glass barrier.

EXAMPLE 3

The procedure of Example 1 was followed and the conditions of Table I as given except the non-tinning coating stripes were of the compositions in parts by weight on each sample are given in Table I for Pt, Au-2 and Au-3 and Table II for the glass barrier.

EXAMPLE 4

The procedure of Example 1 was followed and the conditions of Table I as given except the non-tinning coating stripes were of the compositions in parts by weight on each sample are given in Table I for Pt/Pd, Au-1, Au-4 and Table II for glass barrier.

The Examples 1–4 were only sensitive enough to determine the advantages or disadvantages of barrier structures on a gross basis. On this basis, the glass dams permitted more visual corrosion than any of the non-tinning metals. The non-tinning gold dams showed much less visual corrosion, typically less than any other metals used in these examples. As an example, the areas around the gold barrier were bright after as many as 480 hours on the tests. The glass barriers were severely corroded in as little as 24 hours. The areas around the palladium barriers were darkened by corrosion by 68 hours. The area around the platinum and platinum/palladium showed corrosion at 146 hours. The test times are unacceptable for all but gold.

EXAMPLES 5 and 6

A pattern of 5, 10 and 15 mil wide lines was screened with a silver palladium oxide paste and fired as described in Example 1. The composition was:

| | | |
|---|---|---|
| Ag | 74.6 | |
| PdO | 21.5 | Solids 81% |
| Glass Frit 1 | 3.9 | |
| (from Table 1) | | |
| Vehicle | | 19 |

Gold barrier stripes were formed on the conductor lines, which barrier had the following composition, when deposited, in parts by weight:

| | |
|---|---|
| Au | 77% |
| Colloidal Silica | 2% |
| Frit 1 (from Table 1) | 4% |
| Gold Resinate | 11% |
| Silicon Resinate | 6% |

The barrier stripes were fired as described in Example 1. The conditions and number of samples from Examples 5 and 6 are shown in Table IV. As controls on Example 5, 14 4-mil lines on 8-mil centers were screened with glass #1 across some of the 10-mil lines only. The glass barrier composition was in parts by weight:

| Glass #1 | |
|---|---|
| $SiO_2$ | 65.5 |
| $B_2O_3$ | 24.1 |
| $Na_2O$ | 4.1 |
| $K_2O$ | 4.1 |
| $Al_2O_3$ | 2.2 |

For controls on Example 6, 10 samples each were screened with glass #1 and glass #2 in exactly the same format. All specimens were randomized for tinning and heat treating. The glass composition in parts by weight was as follows:

| Glass #2 | |
|---|---|
| $Al_2O_3$ | 11 |
| $SiO_2$ | 39.3 |
| PbO | 20.4 |
| $B_2O_3$ | 19.6 |
| BaO | 9.7 |

The samples were placed in a dessicator containing sulfur maintained at 125° C (900 ppm. sulfur). Conductivity readings were taken with Simpson type ohm meters, and samples were examined optically. The meter accuracy is estimated to have been about ±.2 ohms, based on the variability in samples that did not change resistance within a long period of time. The results are given in Table V for Example 5 and Table VI for Example 6 in resistance in ohms/inch for the samples prior to the corrosion test and at various times during the test.

Even these badly depleted samples of silver/palladium oxide paste did not show large resistance changes with gold dams in either 500 or 936 hours at 125° C. The gold dams slightly lowered the resistance of the fired silver/palladium oxide conductor (about 0.1 ohm per inch). Tinning further decreased the resistance up to 0.3 ohms per inch. The gold barrier structures did not totally eliminate sulfide corrosion products as observed visually from the top; such crystals appeared as early as 116 hours on the single fired gold barrier specimens. However, in Example 5, only extremely small crystals were observed on double fired dams after as long as 768 hours. This implies that double barrier layer firing is advantageous with respect to visible corrosion. No differentiation in resistance changes was noted for any of the firing variations, or static tinning versus vibration tinning. Glass barrier layer resistance changes of 0.5 ohms occurred on the 10-mil lines in Example 5 as early as 138 hours, with the majority of the changes beginning at 304 hours. In Example 6, the resistance changes of the glass samples began at about 94 hours.

The glass #1 and #2 controls were taken off test at 504 hours, since it was obvious that heavy corrosion and resistance changes were occurring on almost all specimens.

The following is a summation of Table V of Example 5 given in resistance in ohms:

| Initial Land Resistance | Change Due To Barrier | Change Due To Tinning & Reflow | Change at 350 hrs. | Typical Change at 950 hrs. |
|---|---|---|---|---|
| Gold Barrier eg .9-1.0 | 0 to -.1 | 0 to -.3 | 0 to .4 | 0 to .4 |
| Glass Barrier | | | 0 to 3.0 | Over 5 |

Example 5 was carried out to 1100 hours, with no resistance changes as high as a half ohm. The glass barrier specimens showed visible corrosion (blackening) at the first readout of the test. No difficulty was experienced with electrical shorting of the gold barriers. The gold barrier pastes screen rather well and do not flow during firing like the glass materials. One line dammed with gold from Example 5 (sample #6), showed a resistance increase starting at about 200 hours. Microscopic examination showed large corrosion products on the tinned silver/palladium area between dams. This appeared to be corrosion of the undepleted silver/palladium alloy, which has not shown to be a field failure mechanism.

Table IV

| | Example 5 | Example 5 |
|---|---|---|
| Lines per sample | 3 | 3 |
| Total samples | 33 | 30 |
| Conductor Firing Temperatures | 825° C | 825° C |
| Land firings | 1 and 2 | 1 |
| Barrier firings | 1 and 2 | 2 |
| Extra glass firing | 1 | — |
| Heat treat reflow | 2 chip cycles | 1 hour at 258° C |
| Tinning (i.e. solder coating) | Yes | Yes |
| Silicone Gel - Dow Corning Sylgard 51 | No | Yes |
| Number of barriers | 6 | 8 |
| Conductor thickness | 22–29μ | 22–29 μ |
| Au barrier sites | 308 | 400 |
| Control | Glass on some lines | 2 separate glass barrier specimens (10 each) |

Table V

| 825° C Land Fire | 825° C Dam Fire | 825° C Glass Fire | 2 Reflows | Vibration Tinned | Resistance for 10 Mil Wide Line, Ohms Land | With Barrier | Reflowed, Tinned | 350 Hrs. | 936 Hrs. |
|---|---|---|---|---|---|---|---|---|---|
| 1 | 1 | | X | | .9 | .8 | .9 | .9 | 1.0 |
| 1 | 1 | | X | | .9 | .9 | .9 | 1.0 | 1.0 |
| 1 | 1 | | X | | .9 | .8 | X | .8 | .9 |
| 1 | 1 | | X | | .9 | X | .8 | .9 | 1.0 |
| 1 | 1 | | X | | .9 | .9 | .7 | .7 | 1.1 |
| 1 | 1 | | X | | .9 | .8 | .7 | .7 | .8 |
| 1 | 2 | | X | | 1 | .9 | X | X | X |
| 1 | 2 | | X | | .9 | X | .7 | .7 | 1.0 |
| 1 | 2 | | X | | .9 | .8 | .8 | .8 | .8 |
| 2 | 1 | | X | | .9 | X | .8 | .8 | .8 |
| 2 | 1 | | X | | 1.0 | 1.0 | .7 | X | X |
| 2 | 1 | | X | | .9 | X | .8 | .9 | 1.0 |
| 2 | 1 | | X | | .9 | X | .6 | .7 | .8 |
| 2 | 2 | | X | 137 138 | X | X | .8 | .8 | .9 |
| 1 | 2 | 1 | X | | 1.0 | x | .9 | 1.0 | 1.4 |
| 1 | 2 | 1 | X | | | | .9 | 1.6 | 12.0 |
| 1 | 2 | 1 | X | | | | .8 | 1.95 | 11.0 |
| 1 | 2 | 1 | X | | | 1.0 | 1.0 | 1.5 | 9.0 |
| 1 | 2 | 1 | X | | | | .7 | 1.8 | OPEN |
| 1 | 2 | 1 | X | | | | .8 | 1.9 | 6.5 |
| 1 | 2 | 1 | X | | Glassed Lines | | 1.0 | 1.0 | 8.0 |
| 1 | 2 | 1 | X | | | | .8 | 1.3 | 3.4 |
| | | 1 | X | | | | .8 | 4.0 | 50.0 |
| | | | X | | | | | 1.0 | 1.6 |
| 1 | 1 | | X. | | 1.0 | 1.0 | 1.2 | 1.4 | 1.3 |
| 1 | 1 | | X | X | .9 | .9 | 1.2 | 1.1 | 1.1 |
| 1 | 1 | | X | X | 1.0 | 1.0 | 1.25 | 1.1 | 1.3 |
| 1 | 1 | | X | X | .9 | .9 | 1.2 | 1.1 | 1.0 |
| 1 | 1 | | X | X | 1.0 | 1.0 | 1.15 | 1.05 | 1.2 |
| 1 | 1 | | X | X | 1.0 | 1.0 | 1.1 | 1.05 | 1.0 |
| 1 | 1 | | X | X | .9 | .9 | 1.4 | 1.15 | 1.4 |
| 1 | 1 | | X | X | 1.0 | 1.0 | 1.25 | 1.1 | 1.2 |
| 1 | 1 | | X | X | 1.0 | 1.0 | 1.2 | 1.05 | 1.05 |

Table VI

| $T_0$ | 94 Hrs. | 336 Hrs. | 504 Hrs. |
|---|---|---|---|
| Gold Barriers | | | |
| .75 | .75 | .7 | .85 |
| 1.1 | 1.1 | 1.0 | 1.2 |
| .9 | .95 | .9 | 1 |
| .9 | 1.1 | 1.0 | 1.1 |
| 1.0 | 1.0 | 1.4 | 1.8 |
| 1.0 | 1.3 | 1.1 | 1.2 |
| .8 | .85 | .8 | .85 |
| .9 | 1.1 | 1 | 1 |
| 1.0 | 1.05 | 1 | 1.05 |
| 1.0 | 1.1 | 1.1 | 1 |
| .9 | .95 | 1.1 | 1.1 |
| Glass #2 Barriers | | | |
| 1.0 | 1.6 | 1.8 | 2 |
| .85 | OFF | | |
| 1.0 | 4.0 | 5.6 | 7 |
| .9 | 1.9 | 2.2 | 2.4 |
| 1.0 | — | | |
| 1.1 | 1.3 | 1.3 | 1.3 |
| 1.2 | 1.2 | 1.3 | 1.4 |
| 1.3 | 1.5 | 4.8 | 1.9 |
| 1.4 | 2.1 | 2.1 | OPEN |
| 1.1 | 1.2 | 1.2 | 1.4 |
| .8 | 8.6 | — | |
| 1.0 | OFF | 0 | |
| Glass #1 Barriers | | | |
| 1.0 | 1.9 | OFF | — |
| 1.2 | 2.4 | 5.8 | 7.0 |
| 1.2 | 1.2 | 1.3 | 1.5 |
| 1.0 | 1.1 | 1.2 | 1.7 |
| 1.2 | 1.3 | 3.4 | OPEN |
| 1.2 | 1.15 | 1.2 | 1.7 |
| 1.2 | 1.1 | 1.25 | 1.3 |
| 1.15 | 1.8 | 8.4 | 12 |
| 1.0 | .95 | 1.0 | 1.3 |
| .95 | .85 | 1.1 | 1.5 |
| 1.3 | 1.35 | 3.1 | 4 |

EXAMPLES 7 and 8

A gold-silver-palladium ternary conductor, silver-palladium conductor, and high surface area silver/palladium conductor 9, each having non-tinning gold barriers (Example 7) and with glass barriers (Example 8) thereon.

Conductive lands of the following compositions in parts by weight were formed on alumina substrates:

| | A | | B | | C |
|---|---|---|---|---|---|
| Ag | 57.6 | Ag | 76.8 | Ag | 74.6 |
| Pd | 19.2 | Pd | 19.2 | PdO | 21.5 |
| Au | 19.2 | $Bi_2O_3$ | 4 | Glass frit | 3.9 |
| Glass frit | 4 | Glass frit | 2 | ($Al_2O_3$ 2.2 | |
| | 79.5 solids | | 75 solids | | 81 solids |
| ($Al_2O_3$ | 2.2 | ($Al_2O_3$ | 3.2 | $SiO_2$ | 22.2 |
| $SiO_2$ | 22.2 | $SiO_2$ | 29 | PbO | 66.6 |
| PbO | 66.6 | PbO | 51 | $B_2O_3$ | 8.8) |
| $B_2O_3$ | 8.8 | $B_2O_3$ | 9 | | |
| | | $ZrO_2$ | 1.2 | | |
| | | $TiO_2$ | 2 | | |
| | | $Na_2O$ | 1.7 | | |
| | | CdO | 2.8) | | |
| Vehicle | 20.5 | Vehicle | 25. | Vehicle | 19. |

The lands were fired once at 825° C using the FIG. 3 firing cycle. 150 barrier coating stripes were applied across each land. Their composition in parts by weight were:

| Glass Barrier | | Gold | |
|---|---|---|---|
| Al$_2$O$_3$ | 3.2 | Au Powder | 77 |
| SiO$_2$ | 29 | Cab-o-sil Colloidal Silica | 2 |
| PbO | 51 | Frit 1(from Table I) | 4 |
| B$_2$O$_3$ | 9 | 6566 Au Resinate (Hanovia Div. Englehard Ind.) | 11% |
| ZrO$_2$ | 1.2 | Silicon Resinate | 6% |
| TiO$_2$ | 2 | | |
| Na$_2$O | 1.7 | | |
| CdO | 2.8 | | |

The barrier stripes were then fired once at 825° C using the FIG. 3 firing cycle. Solder was then deposited by dipping the composite in a 90 lead-10 tin solder bath on the areas of the lands not covered with the barriers. The samples were heated for 1 hour at 285° C to deplete the palladium with the lead from the solder, aggravating the potential for sulfide corrosion of the remaining silver. The samples were placed in a chamber containing sulfur maintained at 125° C, which gives an atmosphere containing 900 ppm sulfur. The number of opens per 30 conductor segments, each containing 50 barriers for each of the compositions over a period of 709 hours is given in Table VII for Examples 7A, B, C and 8A, B, C.

Table VII

Number of Opens per 30 Segments (Containing 50 Barriers Each)

Example 8

| Glass Barrier | 115 Hrs. | 231 Hrs. | 303 Hrs. | 415 Hrs. | 504 Hrs. | 709 Hrs. |
|---|---|---|---|---|---|---|
| A | 0 | 1 | 3 | 3 | 3 | 4 |
| B | 3 | 4–6 | 6 | 6 | 6 | 6 |
| C | 11 | 12 | 13 | 16 | 23 | 30(100%) |

Example 7

| Gold Barrier | | | | | | |
|---|---|---|---|---|---|---|
| A | 0 | 0 | 0 | 0 | 0 | 0 |
| B | 0 | 0 | 0 | 0 | 0 | 0 |
| C | 0 | 0 | 0 | 0 | 0 | 0 |

The Table VII shows that not a single gold barrier failure was observed while substantial failures on glass barriers were observed.

EXAMPLES 9-14

Several different silver/palladium oxide pastes conductors were tested with the non-tinning gold barrier stripes.

Each of the Examples 9–14 has 80% silver and either 20% palladium or 20% palladium oxide of the conductive portion of the conductive lands. The variation in the surface area from Example to Example in m$^2$/gm is given in the Table V.

The glass frit compositions used in the conductive lands were the Bismuth oxide BiO$_3$ and glass frit combination given in the Table VIII as #3 of B in Example 7 and 8 and the following:

| | #1 | #2 |
|---|---|---|
| SiO$_2$ | 22.4 | 16.4 |
| Al$_2$O$_3$ | 2.2 | 2.1 |
| PbO | 66.6 | 75.7 |
| B$_2$O$_3$ | 8.8 | 5.8 |

The glass composition used for the glass barrier stripes was:
SiO$_2$: 65.5
Al$_2$O$_3$: 2.2
Na$_2$O: 4.1
K$_2$O: 4.1
B$_2$O$_3$: 24.1

The formation and firing of the conductor lands and barrier stripes were done as described in Examples 7 and 8.

The solder coating and corrosion test procedure also was the same as that described in conjunction with Examples 7 and 8.

Table VIII

| Examples | Surface Area in m$^2$/gm | | | Glass Frit in Parts By Wt. | No. of Au Barrier Samples | | Percent of Opens | | | |
|---|---|---|---|---|---|---|---|---|---|---|
| | Ag | Pd | PdO | | | | 60 Hrs. | 110 Hrs. | 220 Hrs. | 514 Hrs. |
| 9 | 1.9 | 19.5 | | 4 #1 | 7 | Au | 0 | 0 | 0 | 0 |
| | | | | | | Glass | 0 | 0 | 16 | 50 |
| 10 | 1.9 | 19.5 | | 6 #3 | 6 | Au | 0 | 0 | 0 | 0 |
| | | | | | | Glass | 0 | 0 | 0 | 5 |
| 11 | 1.9 | 19.5/ 7.5 (1/1) | | 4 #2 | 7 | Au | 0 | 0 | 0 | 0 |
| | | | | | | Glass | 0 | 2 | 5 | 5 |
| 12 | .4 | 7.5 | | 4 #1 | 8 | Au | 5 | 13 | 13 | 13 |
| | | | | | | Glass | 25 | 50 | 100 | 100 |
| 13 | .4 | | .8 | 4 #1 | 4 | Au | 0 | 6 | 6 | 6 |
| | | | | | | Glass | 16 | 30 | 100 | 100 |
| 14 | 1.9 | | .8 | 4 #1 | 7 | Au | 0 | 0 | 0 | 0 |
| | | | | | | Glass | 24 | 47 | 66 | Not Continued |

(Same conditions as Table V. 25 Samples, glass each cell)

Table VIII shows that the gold barriers are clearly superior to the glass barriers in all cases. The only instances where failure occurred, after a long period of time, were on a very bad low surface area palladium paste and on the equivalently bad low surface area palladium oxide paste. There were never any high surface area silver/palladium conductor fails with a gold barrier on it, even when depleted and for very extended periods of time.

While the invention has been described in detail with reference to specific embodiments thereof, it will be apparent to one skilled in the art that various changes and modifications can be made therein without departing from the spirit and scope thereof.

I claim:

1. The method of forming a barrier structure on a conductive electrode comprising:
   providing on a substrate a conductive electrode composed of predominently silver and a lesser quantity of one or more of a platinum group metal;
   depositing over a portion of said electrode a homogeneous mixture comprising a gold powder and a finely divided material which upon heating to an elevated temperature will coalesce and upon cooling form a continuous layer;
   heating and composite to said elevated temperature to cause said coalescence and for a time to cause a diffusion of a portion of said gold into said portion of the electrode wherein a gold-silver-platinum group metal alloy is formed therein; and
   cooling said composite.

2. The method of claim 1 wherein the platinum group metal is palladium.

3. The method of claim 1 wherein the said elevated temperature is between about 750° C and 1050° C.

4. The method of claim 1 wherein the said diffusion is continued until there is greater than about 20% by weight gold in said portion of the electrode.

5. The method of claim 4 wherein the said platinum group metal is palladium.

6. The method of claim 5 wherein the amount of silver in said electrode is greater than about 75%.

7. The method of claim 1 wherein the composite is then subjected to a lead bearing solder which coats the entire said electrode except said continuous layer.

8. The method of claim 7 wherein said solder contains greater than about 80% by weight lead.

9. The method of claim 7 wherein said layer forms a barrier at a chip joining site.

10. The method of claim 7 wherein said layer forms a barrier at a cross-over site.

* * * * *